US011557639B2

(12) United States Patent
Zhou

(10) Patent No.: US 11,557,639 B2
(45) Date of Patent: Jan. 17, 2023

(54) DISPLAY PANEL AND DISPLAY DEVICE WITH LIGHT-EMITTING PORTIONS HAVING CENTERS AT DISTANCE OF 5μM OR LESS

(71) Applicant: Wuhan China Star Optoelectronics Semiconductor Display Technology Co., Ltd., Wuhan (CN)

(72) Inventor: Sisi Zhou, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 183 days.

(21) Appl. No.: 16/758,056

(22) PCT Filed: Mar. 24, 2020

(86) PCT No.: PCT/CN2020/080777
§ 371 (c)(1),
(2) Date: Apr. 22, 2020

(87) PCT Pub. No.: WO2021/174604
PCT Pub. Date: Sep. 10, 2021

(65) Prior Publication Data
US 2022/0045154 A1    Feb. 10, 2022

(30) Foreign Application Priority Data
Mar. 6, 2020    (CN) .................. 202010150019.X

(51) Int. Cl.
*H01L 27/32*    (2006.01)

(52) U.S. Cl.
CPC ................... *H01L 27/3276* (2013.01)

(58) Field of Classification Search
CPC .................................... H01L 27/3276
See application file for complete search history.

(56) References Cited

U.S. PATENT DOCUMENTS

| | | | |
|---|---|---|---|
| 2014/0168037 A1* | 6/2014 | Sakariya | G09G 3/3233 345/82 |
| 2014/0239262 A1 | 8/2014 | Kim et al. | |
| 2015/0276175 A1* | 10/2015 | Moriya | H01L 27/322 349/61 |
| 2016/0351116 A1* | 12/2016 | Sun | G09G 3/2003 |
| 2017/0323598 A1 | 11/2017 | Park et al. | |
| 2019/0229235 A1* | 7/2019 | Iguchi | H01L 33/32 |

(Continued)

FOREIGN PATENT DOCUMENTS

| | | |
|---|---|---|
| CN | 104466007 | 3/2015 |
| CN | 205091725 | 3/2016 |

(Continued)

*Primary Examiner* — Lex H Malsawma

(57) ABSTRACT

The present application provides a display panel and a display device. The display panel includes a substrate, a driving circuit layer disposed on the substrate, and a light-emitting layer disposed on the driving circuit layer. The driving circuit layer includes a first metal layer, the first metal layer includes a first metal trace, the light-emitting layer includes multiple light-emitting portions, and a vertical distance between an orthographic projection of a center of each light-emitting portion projected on the first metal layer and a symmetry axis of the first metal trace is less than or equal to 5 μm.

14 Claims, 3 Drawing Sheets

(56) References Cited

U.S. PATENT DOCUMENTS

| | | | |
|---|---|---|---|
| 2019/0237494 A1* | 8/2019 | Bae | H01L 27/3262 |
| 2020/0043990 A1* | 2/2020 | Huangfu | G09G 3/3225 |
| 2020/0185579 A1* | 6/2020 | Steudel | H01L 33/58 |
| 2020/0301147 A1* | 9/2020 | Klug | G02B 26/023 |

FOREIGN PATENT DOCUMENTS

| | | |
|---|---|---|
| CN | 107644888 | 1/2018 |
| CN | 107819010 | 3/2018 |
| CN | 108155205 | 6/2018 |
| CN | 109427854 | 3/2019 |
| CN | 109786434 | 5/2019 |
| CN | 110265460 | 9/2019 |
| CN | 110610980 | 12/2019 |

* cited by examiner

DISPLAY PANEL AND DISPLAY DEVICE WITH LIGHT-EMITTING PORTIONS HAVING CENTERS AT DISTANCE OF 5μM OR LESS

RELATED APPLICATIONS

This application is a National Phase of PCT Patent Application No. PCT/CN2020/080777 having International filing date of Mar. 24, 2020, which claims the benefit of priority of Chinese Patent Application No. 202010150019.X filed on Mar. 6, 2020. The contents of the above applications are all incorporated by reference as if fully set forth herein in their entirety.

FIELD AND BACKGROUND OF THE INVENTION

The present application relates to a field of display technology and in particular, to a display panel and a display device.

In a manufacturing process of organic light-emitting diode (OLED) display panels, a passivation layer is formed over a driving circuit layer, and then an organic light-emitting layer is formed over the passivation layer. A metal film used to form the source/drain traces in the driving circuit layer has a greater thickness. For example, when a multilayer metal film is used for the source and drain traces, the film thickness can be more than 700 nm. Consequently, even though the passivation layer is formed thereon, it is difficult to achieve planarization. The areas at two sides of the organic light-emitting layer with the source/drain traces as their dividing line are different, which leads to asymmetrical color shifts viewed from left and right viewing angles.

SUMMARY OF THE INVENTION

Accordingly, it is an objective of the present application to provide a display panel, a display device, and a manufacturing method of the display panel, which can avoid asymmetrical color shifts at left and right viewing angles.

The present application provides a display panel, comprising:

a substrate;

a driving circuit layer disposed on the substrate; and a light-emitting layer disposed on the driving circuit layer;

wherein the driving circuit layer comprises a first metal layer, the first metal layer comprises a first metal trace, the light-emitting layer comprises a plurality of light-emitting portions, and a vertical distance between an orthographic projection of a center of each light-emitting portion projected on the first metal layer and a symmetry axis of the first metal trace is less than or equal to 5 μm.

According to one embodiment of the present application, the vertical distance between the orthographic projection of the center of each light-emitting portion projected on the first metal layer and the symmetry axis of the first metal trace is less than or equal to 2 μm.

According to one embodiment of the present application, the orthographic projection of the center of each light-emitting portion projected on the first metal layer overlaps with the symmetry axis of the first metal trace.

According to one embodiment of the present application, a first passivation layer is disposed between the first metal layer and the light-emitting layer.

According to one embodiment of the present application, the driving circuit layer further comprises a second metal layer, the second metal layer comprises a second metal trace, the second metal layer is disposed between the first metal layer and the substrate, and a second passivation layer is disposed between the first metal layer and the second metal layer.

According to one embodiment of the present application, the first metal layer is a first source/drain layer.

According to one embodiment of the present application, the second metal layer is a second source/drain layer.

According to one embodiment of the present application, an orthographic projection of the light-emitting portion projected on the second metal layer overlaps with an orthographic projection of a portion of the first metal trace projected on the second metal layer.

According to one embodiment of the present application, the first metal layer is made of a titanium-aluminum-titanium laminate.

The present application further provides a display device, comprising the display panel mentioned above.

Advantages of the Present Application

Compared with conventional techniques, the display panel and the display device of the present application arrange the center of the light-emitting portion as close as possible to the symmetry axis of the metal trace located below the light-emitting portion. Therefore, even if the passivation layer under the light-emitting portion is not flat enough, the present application can improve the asymmetry at left and right viewing angles and improve display quality.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the figures are merely for the purposes of illustrating some embodiments of the present disclosure, and a person having ordinary skill in this field can obtain other figures according to these figures without inventive work.

DESCRIPTION OF SPECIFIC EMBODIMENTS OF THE INVENTION

The technical solutions of the present application will be clearly and completely described below with reference to the accompanying drawings and specific embodiments of the present application. Obviously, the described embodiments are only some of the embodiments of the present application, and not all of the embodiments. Based on the embodiments in the present application, all other embodiments obtained by those skilled in the art without inventiveness fall into the protection scope of the present application.

Figure 1:
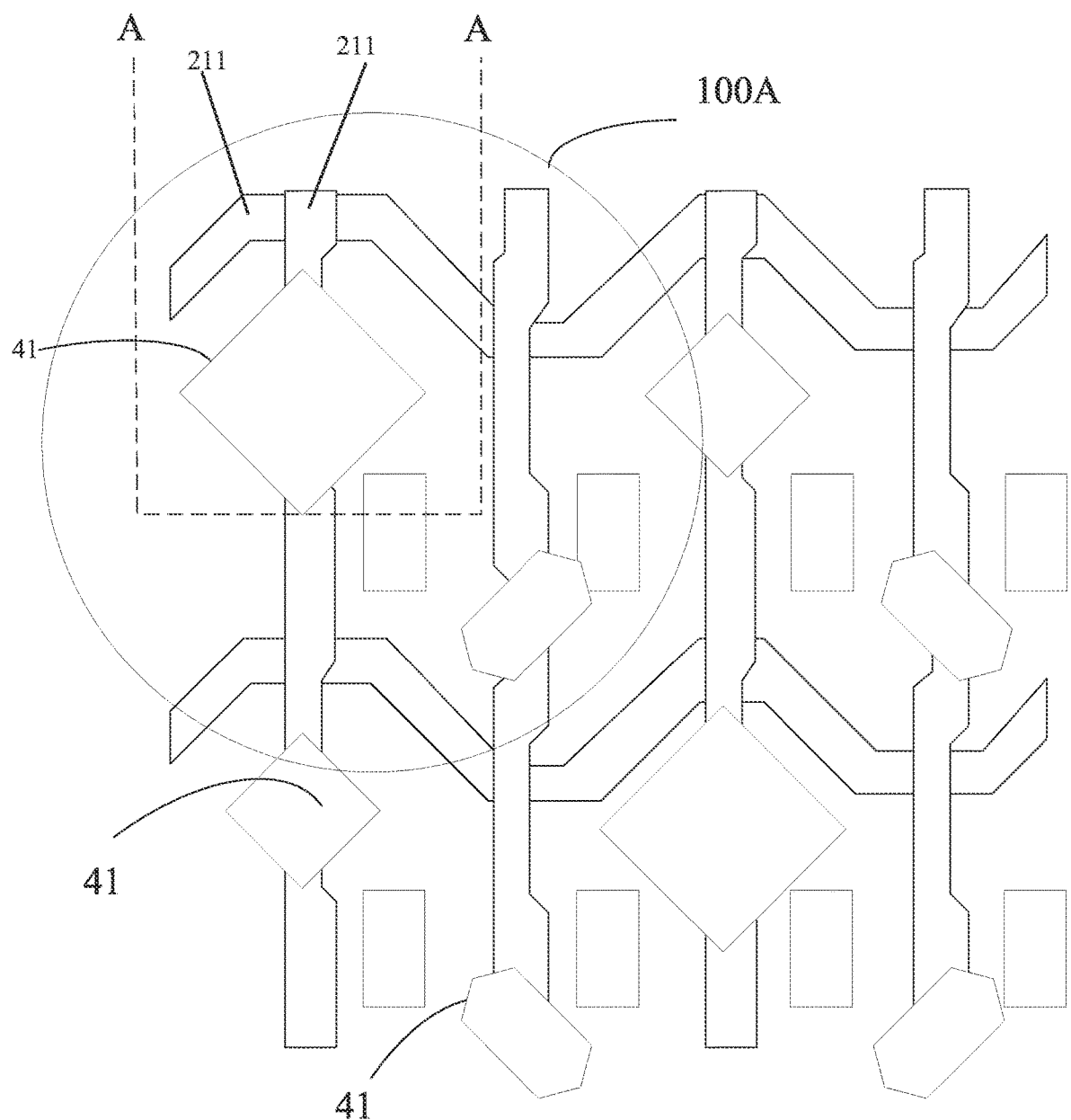
FIG. 1 is a top view illustrating a display panel according to one embodiment of the present application.
Figure 2:
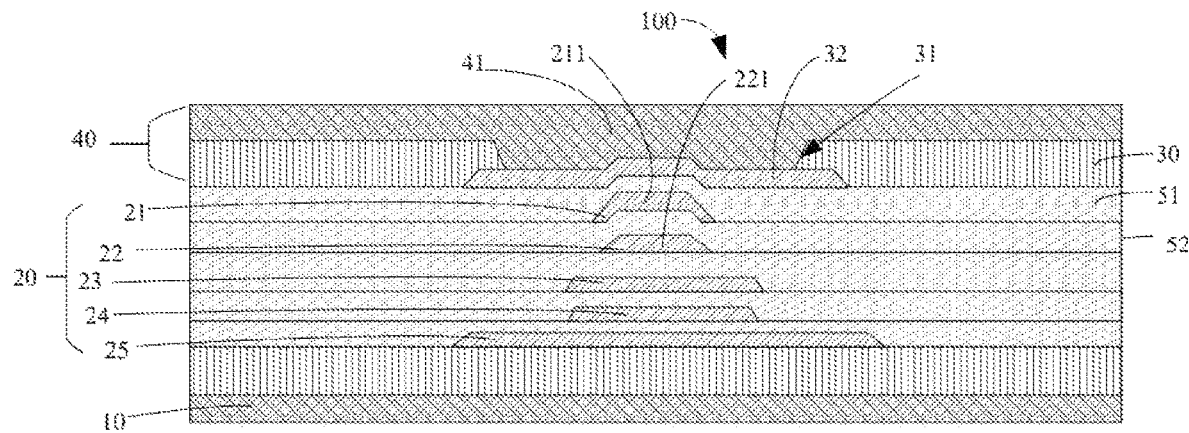
FIG. 2 is a cross-sectional view taken along line A-A of FIG. 1 illustrating the display panel.

Please refer to FIG. 1 and FIG. 2, which illustrate a display panel 100 according to a first embodiment of the present application. In the present embodiment, an organic light emitting diode (OLED) display panel is used as an example. However, the display panel 100 of the present application can also be other types of display panels, such as quantum dot light-emitting diode (QLED) display panels, micro-LED display panels, and Mini-LED display panels.

The display panel 100 comprises a substrate 10, a driving circuit layer 20 disposed on the substrate 10, a pixel definition layer 30 disposed on the driving circuit layer 20, and a light-emitting layer 40 disposed on the driving circuit layer 20 and arranged in the pixel definition layer 30.

The substrate 10 is a transparent substrate, which can be made of a hard material such as glass or quartz, or made of a flexible material such as a plastic thin film or paper fibers. A light shielding layer, a buffer layer, and etc. can be disposed between the substrate 10 and the driving circuit layer 20.

The driving circuit layer 20 comprises a first metal layer 21, a second metal layer 22, a third metal layer 23, a fourth metal layer 24, and a semiconductor layer 25. The semiconductor layer 25, the fourth metal layer 24, the third metal layer 23, the second metal layer 22, and the first metal layer 21 are sequentially stacked on the substrate 10. Two adjacent layers are electrically insulated and separated from each other by an insulating layer. The driving circuit layer 20 can comprise a plurality of thin film transistors (TFTs) and capacitors. For example, it can be a two-transistor and one-capacitor (2T1C) driving circuit, 3T1C circuit, 7T1C circuit, or etc.

Please refer to FIG. 2. The first metal layer is a first source/drain layer. The first metal layer 21 comprises a first metal trace 211.

The second metal layer 22 is a second source/drain layer. The second metal layer 22 comprises a second metal trace 221.

According to one embodiment of the present application, the first metal layer 21 is made of a titanium-aluminum-titanium laminate. The second metal layer 22 is also made of a titanium-aluminum-titanium laminate.

The third metal layer 23 is a first gate metal layer.

The fourth metal layer 24 is a second gate metal layer.

The semiconductor layer 25 is an active layer of the TFT. The semiconductor layer 25 can be made of amorphous silicon, single-crystal silicon, polysilicon, or an oxide semiconductor material such as indium gallium zinc oxide (IGZO).

A plurality of openings 31 are defined in the pixel definition layer 30, and the openings 31 are used for arranging the light-emitting layer 40 therein.

In an embodiment shown in FIG. 2, the light-emitting layer 40 comprises an anode layer 32 disposed on the driving circuit layer 20, and a hole injection layer, a hole transport layer, an electron transport layer, an organic light-emitting material layer, an electron injection layer, and a cathode layer which are sequentially stacked on the anode layer 32. It is apparent that the light-emitting layer 40 in the present application can comprise only a cathode layer, a light emission layer, and the anode layer 32, and can further comprise one or more of the electron injection layer, the electron transport layer, an electron blocking layer, the hole injection layer, the hole transport layer, a hole blocking layer, and a charge generation layer.

Figure 3:
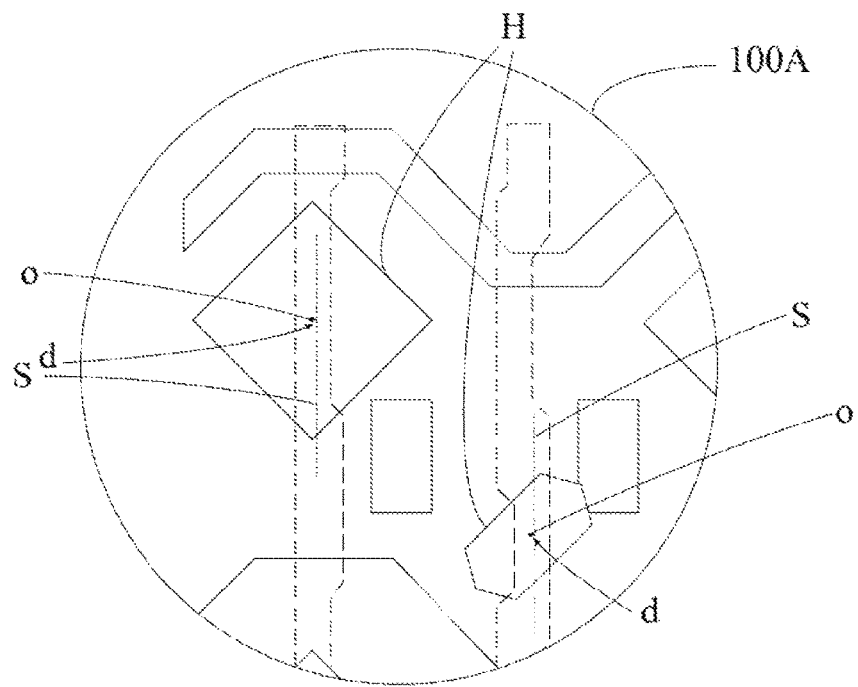
FIG. 3 is a partially enlarged perspective view of the display panel of FIG. 1.

The light-emitting layer 40 comprises a plurality of light-emitting portions 41. The light-emitting portion 41 can be one or more of a red sub-light-emitting portion, a blue sub-light-emitting portion, and a green sub-light-emitting portion for display functions. It can be understood that the light-emitting portion 41 can also include sub-light-emitting portions of other colors. A first passivation layer 51 is disposed between the first metal layer 21 and the light-emitting layer 40. A vertical distance d between an orthographic projection o of a geometric center of a horizontal shape H of each light-emitting portion 41 projected on the first metal layer 21 and a symmetry axis S of the first metal trace 211 is less than or equal to 5 μm. Please refer to FIG. 3 again. FIG. 3 is an enlarged perspective view of a region 100A of the display panel of FIG. 1. A shape of the first metal layer 21 located below the light-emitting layer 40 is drawn with a dashed line in FIG. 3. When the first metal trace 211 is not of uniform width, the symmetry axis S of the first metal trace 211 refers to a symmetry axis along the length direction at a position where the orthographic projection o of the geometric center of the horizontal shape H of the light-emitting portion 41 overlaps with the first metal layer 21. That is the symmetry axis of the first metal trace 211 in a region right under the geometric center of the light-emitting portion 41, and the symmetry axis is parallel to an extending direction of the first metal trace 211. The symmetry axis S is obtained by, for example, creating a line segment starting from the orthographic projection o on the first metal layer 21 projected by the geometric center of the light emitting portion 41 and perpendicular to the extending direction of the first metal trace 211, then finding a midpoint of the line segment and creating a straight line passing through the midpoint A and parallel to the extending direction of the first metal trace 211 to be the symmetry axis S. The vertical distance d between the orthographic projection o of the geometric center of the horizontal shape H of each light-emitting portion 41 projected on the first metal layer 21 and the symmetry axis S of the first metal trace 211 means that, by creating a vertical line starting from the orthographic projection o of the geometric center on the first metal layer 21 and perpendicular to the symmetry axis S, the distance is from the orthographic projection o to an intersection of the vertical line and the symmetry axis S.

According to one embodiment of the present application, the vertical distance d between the orthographic projection o of the geometric center of each light-emitting portion 41 projected on the first metal layer 21 and the symmetry axis S of the first metal trace 211 is less than or equal to 2 μm.

According to another embodiment of the present application, the orthographic projection of the geometric center of each light-emitting portion 41 projected on the first metal layer 21 overlaps with the symmetry axis S of the first metal trace 211.

Since a metal thickness of the first metal layer 21 is greater, it is difficult to obtain a flat surface even though the first passivation layer 51 is disposed on the first metal layer 21. When the light-emitting portion 41 is further disposed on the first passivation layer 51, the geometric center of the light-emitting portion 41 is arranged as close as possible to the symmetry axis S of the first metal trace 211. Therefore, when a user is watching a display screen from left and right sides of the display panel 100, color shifts are basically symmetrical while viewed from the viewing angles on two sides, thus improving the asymmetry viewed from the left and right viewing angles, and improving display quality.

A second passivation layer 52 is disposed between the first metal layer 21 and the second metal layer 22. In one embodiment, the orthographic projection of the light-emitting portion 41 projected on the second metal layer 22 overlaps with a projection of a portion of the first metal trace 211 projected on the second metal layer 22. That is to say, below the light-emitting portion 41, the first metal layer 21 and the second metal layer 22 just overlap each other. As a result, unevenness of the first passivation layer 51 is more obvious. By arranging the geometric center of the light-emitting portion 41 as close as possible to the symmetry axis S of the first metal trace 211, the asymmetry viewed from left and right viewing angles can be improved, and display quality can also be improved.

In addition, the above embodiments only show examples of a dual-gate and dual-source/drain configuration, but the technical solution of the present application is not intended to limit the number of gate electrodes and source/drain electrodes. For example, in one embodiment of the present application, the driving circuit layer 20 can include only the first source/drain layer and the first gate metal layer. Similarly, the distance between the orthographic projection of the geometric center of the light-emitting portion 41 projected on the first metal layer 21 and the symmetry axis S of the first metal trace 211 is less than or equal to 5 µm.

In the present application, the TFT in the driving circuit layer is not limited to a particular type, and the technical solution of the present application can be used in a top gate TFT array substrate and a bottom gate TFT array substrate.

Figure 4:
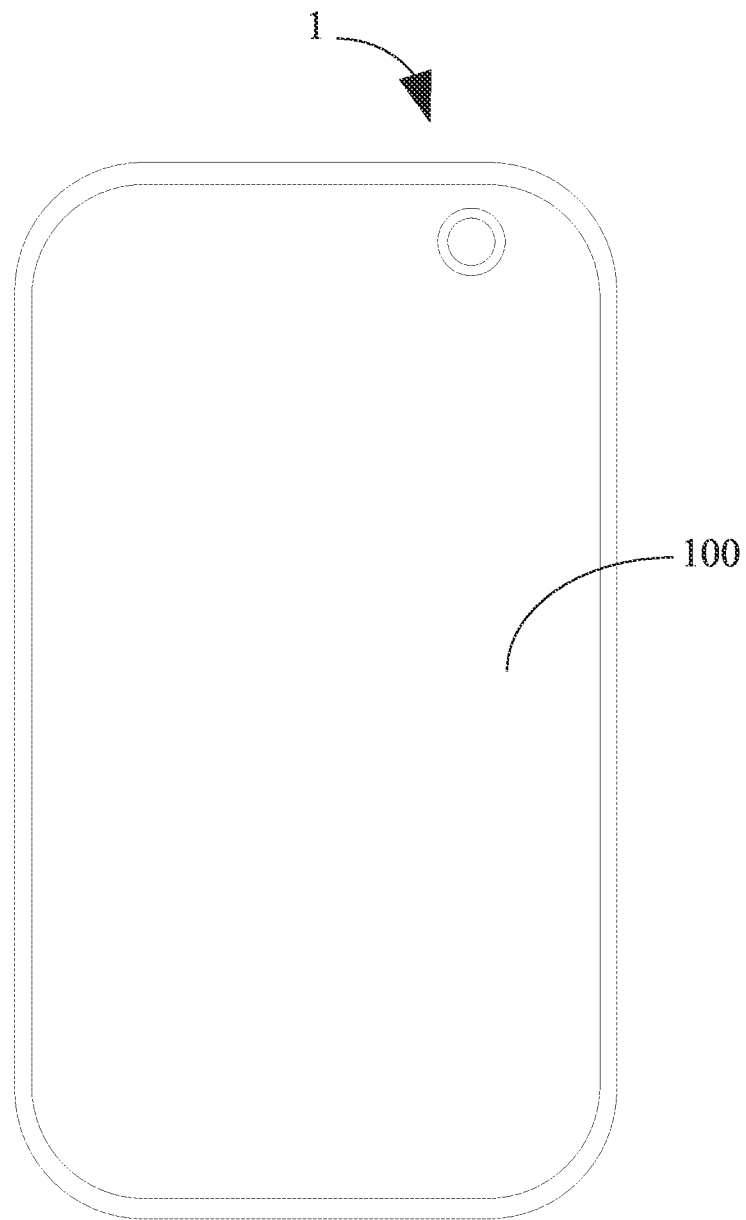
FIG. 4 is a planar view illustrating the display panel according to one embodiment of the present application.

Please refer to FIG. 4. The present application further provides a display device 1 which comprises the display panel 100 described above.

Compared with conventional techniques, the display panel and the display device of the present application arranges the center of the light-emitting portion as close as possible to the symmetry axis of the metal trace located below the light-emitting portion. Such a configuration can improve the asymmetry viewed from left and right viewing angles and improve display quality, even if the passivation layer under the light-emitting portion is not flat enough.

A detailed description about the embodiments of the present application is provided above. Specific examples are used in the present disclosure to explain the principles and embodiments of the present application. The description of the above embodiments is only for ease of understanding the present application. Those skilled in the art can make changes and modifications to the above embodiments and their use based on the idea of the present application. In summary, the content of the present disclosure should not be construed as a limitation on the present application.

What is claimed is:

1. A display panel, comprising:
    a substrate;
    a driving circuit layer disposed on the substrate; and
    a light-emitting layer disposed on the driving circuit layer;
    wherein the driving circuit layer comprises a first metal layer and a first passivation layer, the first passivation layer is disposed between the first metal layer and the light-emitting layer, the first metal layer is a first source/drain layer, the first metal layer comprises a first metal trace, the light-emitting layer comprises a plurality of light-emitting portions, the first passivation layer is disposed on the first metal trace, arranged under the light-emitting portions, and entirely covers the first metal trace, and a perpendicular distance between an orthographic projection of a geometric center of a horizontal shape of each light-emitting portion projected on the first metal layer and an orthographic projection of a symmetry axis of the first metal trace projected on the first metal layer is less than or equal to 5 µm.

2. The display panel according to claim 1, wherein the perpendicular distance between the orthographic projection of the geometric center of the horizontal shape of each light-emitting portion projected on the first metal layer and the orthographic projection of the symmetry axis of the first metal trace projected on the first metal layer is less than or equal to 2 µm.

3. The display panel according to claim 1, wherein the orthographic projection of the geometric center of the horizontal shape of each light-emitting portion projected on the first metal layer overlaps with the orthographic projection of the symmetry axis of the first metal trace projected on the first metal layer.

4. The display panel according to claim 1, wherein the driving circuit layer further comprises a second metal layer, the second metal layer comprises a second metal trace, the second metal layer is disposed between the first metal layer and the substrate, and a second passivation layer is disposed between the first metal layer and the second metal layer.

5. The display panel according to claim 4, wherein the second metal layer is a second source/drain layer.

6. The display panel according to claim 4, wherein an orthographic projection of the light-emitting portion projected on the second metal layer overlaps with an orthographic projection of a portion of the first metal trace projected on the second metal layer.

7. The display panel according to claim 1, wherein the first metal layer is made of a titanium-aluminum-titanium laminate.

8. A display device, comprising the display panel of claim 1.

9. The display device according to claim 8, wherein the perpendicular distance between the orthographic projection of the geometric center of the horizontal shape of each light-emitting portion projected on the first metal layer and the orthographic projection of the symmetry axis of the first metal trace projected on the first metal layer is less than or equal to 2 µm.

10. The display device according to claim 8, wherein the orthographic projection of the geometric center of the horizontal shape of each light-emitting portion projected on the first metal layer overlaps with the orthographic projection of the symmetry axis of the first metal trace projected on the first metal layer.

11. The display device according to claim 8, wherein the driving circuit layer further comprises a second metal layer, the second metal layer comprises a second metal trace, the second metal layer is disposed between the first metal layer and the substrate, and a second passivation layer is disposed between the first metal layer and the second metal layer.

12. The display device according to claim 11, wherein an orthographic projection of the light-emitting portion projected on the second metal layer overlaps with an orthographic projection of a portion of the first metal trace projected on the second metal layer.

13. The display device according to claim 11, wherein the first metal layer is made of a titanium-aluminum-titanium laminate.

14. The display device according to claim 8, wherein the second metal layer is a second source/drain layer.

* * * * *